(12) United States Patent
Moore et al.

(10) Patent No.: US 8,011,951 B2
(45) Date of Patent: Sep. 6, 2011

(54) RAIL MOUNTING APPARATUS

(75) Inventors: Christopher Todd Moore, Troutville, VA (US); Ryan Richard Tenga, Christiansburg, VA (US)

(73) Assignee: General Electric Company, Schenectady, NY (US)

( * ) Notice: Subject to any disclaimer, the term of this patent is extended or adjusted under 35 U.S.C. 154(b) by 277 days.

(21) Appl. No.: 12/489,736

(22) Filed: Jun. 23, 2009

(65) Prior Publication Data

US 2010/0320342 A1  Dec. 23, 2010

(51) Int. Cl.
*H01R 13/60* (2006.01)
(52) U.S. Cl. ........................................ 439/532; 439/716
(58) Field of Classification Search .................. 439/532, 439/94, 715–725
See application file for complete search history.

(56) References Cited

U.S. PATENT DOCUMENTS

| | | |
|---|---|---|
| 4,067,529 A | 1/1978 | Milcoy |
| 4,454,382 A | 6/1984 | Borne et al. |
| 4,900,275 A | 2/1990 | Fasano |
| 4,921,445 A | 5/1990 | Herbert |
| 5,192,227 A * | 3/1993 | Bales .............................. 439/532 |
| 5,362,259 A * | 11/1994 | Bolliger ........................ 439/716 |
| D353,365 S | 12/1994 | Marach |
| 5,704,805 A | 1/1998 | Douty et al. |
| 5,904,592 A | 5/1999 | Baran et al. |
| 6,292,076 B1 | 9/2001 | DeGrazia et al. |
| 7,416,421 B2 | 8/2008 | Kapinos et al. |
| 2008/0108248 A1 | 5/2008 | Lim et al. |

* cited by examiner

*Primary Examiner* — Khiem Nguyen
(74) *Attorney, Agent, or Firm* — Hoffman Warnick LLC; Ernest G. Cusick

(57) ABSTRACT

Rail mounting apparatus including a base having a mount surface including at least one tab for mounting a first edge of the rail relative to the mount surface, a side surface including a guide clip, and a connector guide slot extending from the side surface; a mounting clip including: a body slidingly mounted in the guide clip, a rail engaging member at a first end of the body for engaging a second edge of the rail, a connector mount at a second end of the body; and a connector extending through the guide slot and received in the connector mount of the mounting clip, wherein coupling of the connector to the connector mount slidingly moves the mounting clip in the guide clip to engage the rail engaging member with the second edge of the rail and hold the second edge of the rail relative to the mount surface of the base.

20 Claims, 6 Drawing Sheets

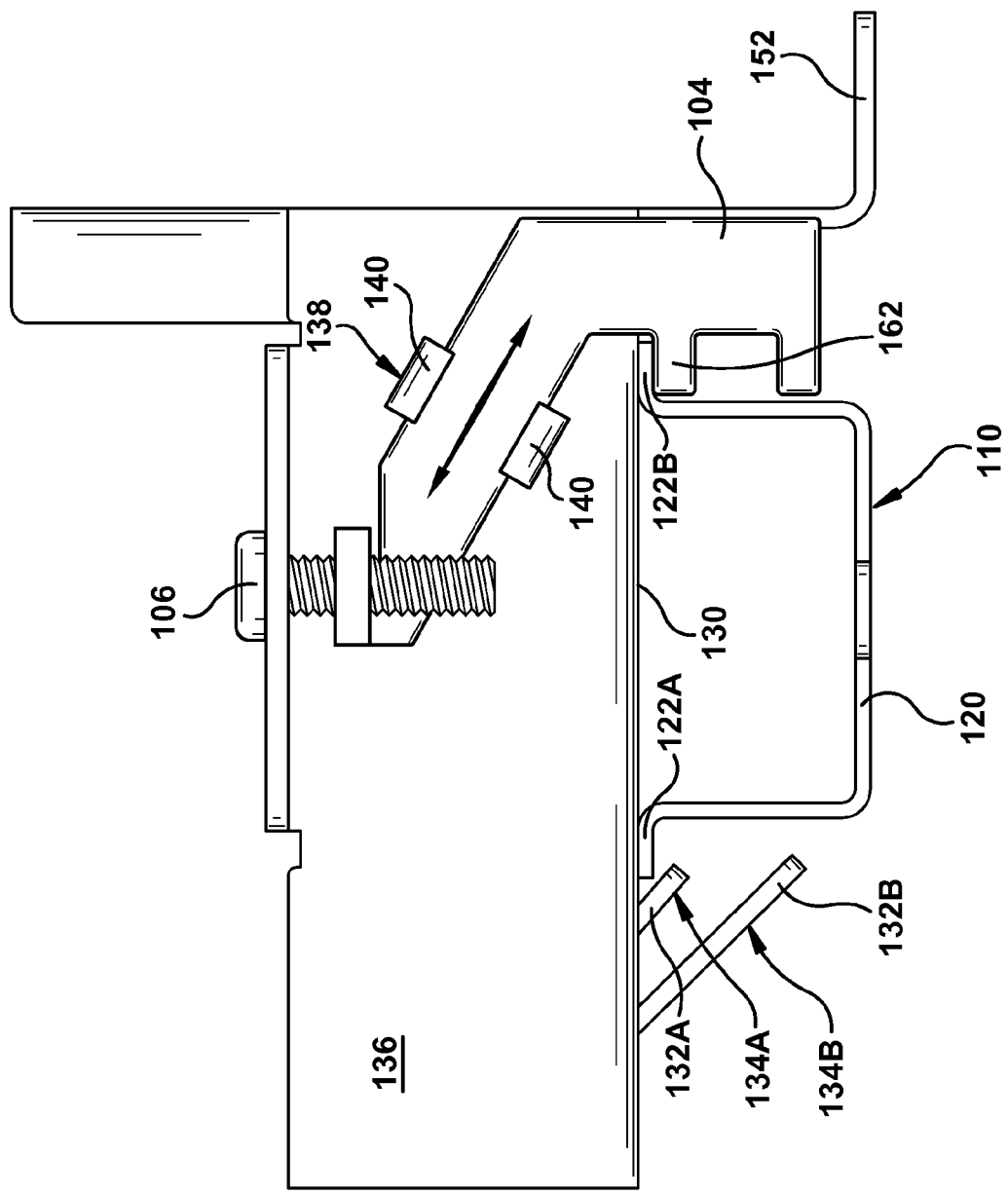

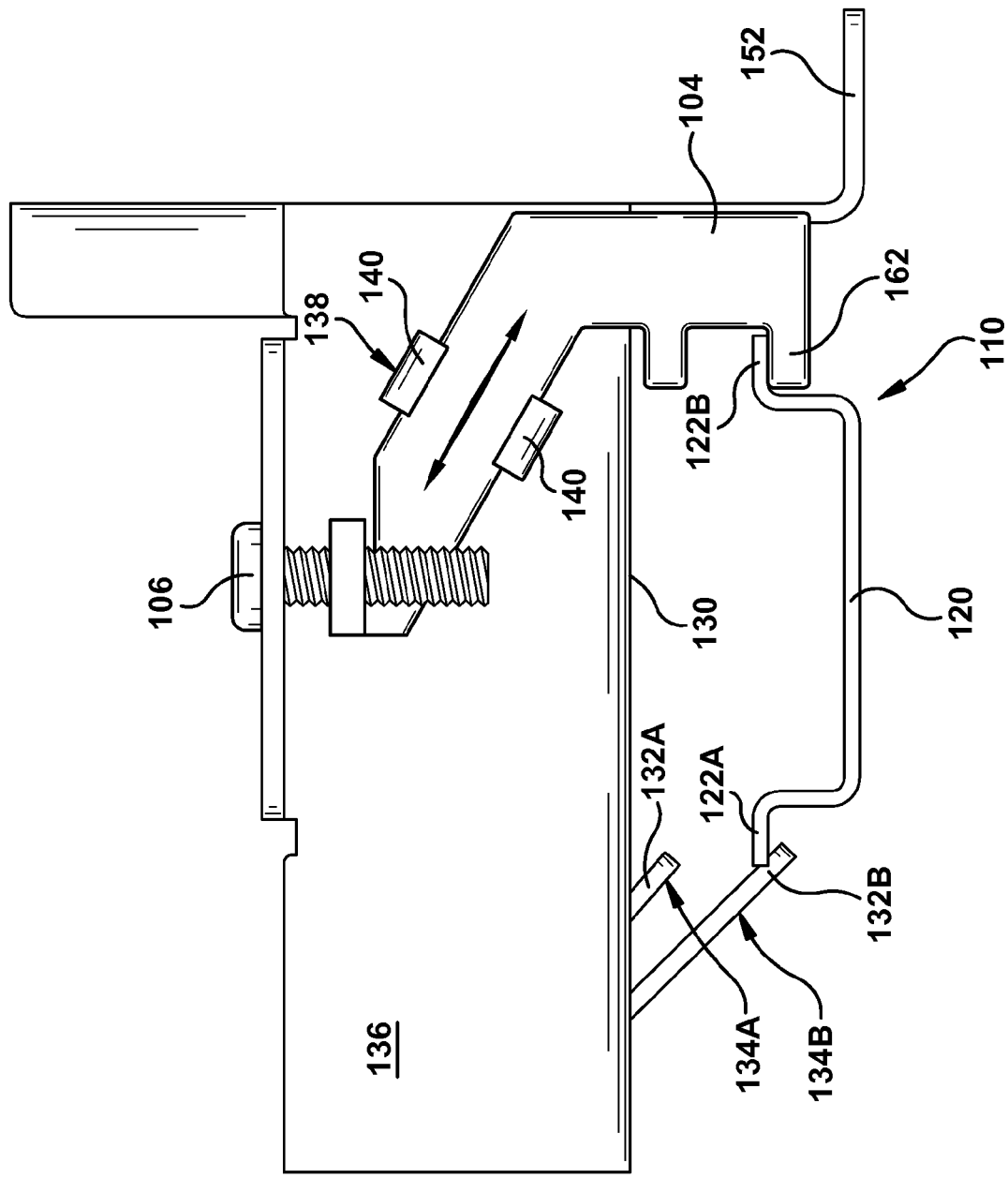

RAIL MOUNTING APPARATUS

BACKGROUND OF THE INVENTION

The invention relates generally to electrical device connectors. More particularly, the invention relates to a rail mounting apparatus for mounting an electrical device to a rail.

Various types of rail connectors have been created for securing electrical devices to a rail such as a DIN rail or top hat rail. The rails typically include an elongated conductive channel member having side edge flanges to which rail connectors can engage/disengage quickly. Current rail connectors exhibit instability relative to larger, heavier devices, which may rock or vibrate off the rail. Past solutions to this problem required screws to mount the device to the back panel, but this technique negates the quick connect/disconnect nature of the rail. Another problem is the inadequate grounding of the component, which usually requires additional hardware to solve. The requirement that the rail electronic device must be of a certain size/type to be rail-mounted (i.e., a particular relay) also poses a challenge. Current designs that attempt to address the above-described problems fail are costly. In particular, a low cost design usually requires minimization of the number of parts, and the amount of material used. However, a majority of current designs used for clamping a component to a rail include complex arrangements including, for example, expensive bendable or spring-tensioned clips.

BRIEF DESCRIPTION OF THE INVENTION

A first aspect of the disclosure provides a rail mounting apparatus comprising: a base including: a mount surface including at least one tab for mounting a first edge of the rail relative to the mount surface, a side surface including a guide clip, and a connector guide slot extending from the side surface; a mounting clip including: a body slidingly mounted in the guide clip, a rail engaging member at a first end of the body for engaging a second edge of the rail, a connector mount at a second end of the body; and a connector extending through the guide slot and received in the connector mount of the mounting clip, wherein coupling of the connector to the connector mount slidingly moves the mounting clip in the guide clip to engage the rail engaging member with the second edge of the rail and hold the second edge of the rail relative to the mount surface of the base.

A second aspect of the disclosure provides a rail mounting apparatus comprising: a base made of a sheet metal material, the base including: a mount surface including at least one tab for mounting a first edge of the rail relative to the mount surface, a side surface including a guide clip including a pair of stamped protrusions in the sheet metal material, and a connector guide slot extending from the side surface; a mounting clip made of a sheet metal material and including: a body slidingly mounted in the guide clip, a plurality of rail engaging members at a first end of the body, a selected one of the plurality of rail engaging members for engaging a second edge of the rail, a connector mount at a second end of the body, the connector mount including a threaded opening containing tab extending substantially perpendicularly from the body of the mounting clip; and a threaded connector extending through the guide slot and received in the threaded opening in the connector mount of the mounting clip, wherein threaded coupling of the connector to the connector mount slidingly moves the mounting clip in the guide clip to engage the selected one of the plurality of rail engaging members with the second edge of the rail and holds the second edge of the rail relative to the mount surface of the base.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

FIGS. 3A and 3B are enlarged side views of the detail of the rail mounting apparatus showing different sized rails.

DETAILED DESCRIPTION OF THE INVENTION

Figure 1:
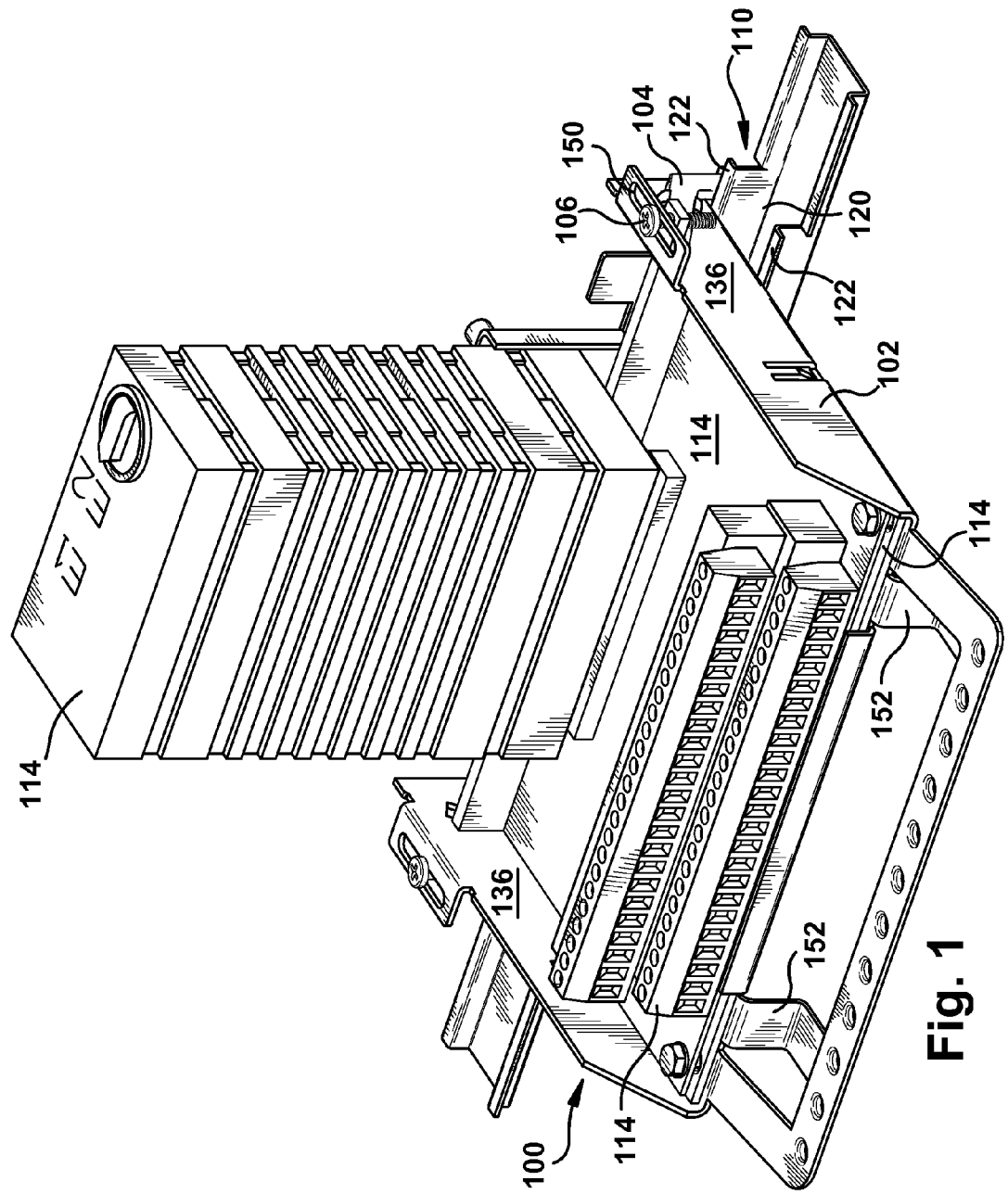
FIG. 1 is perspective view of embodiments of a rail mounting apparatus with an electronic device mounted thereto
Figure 2:
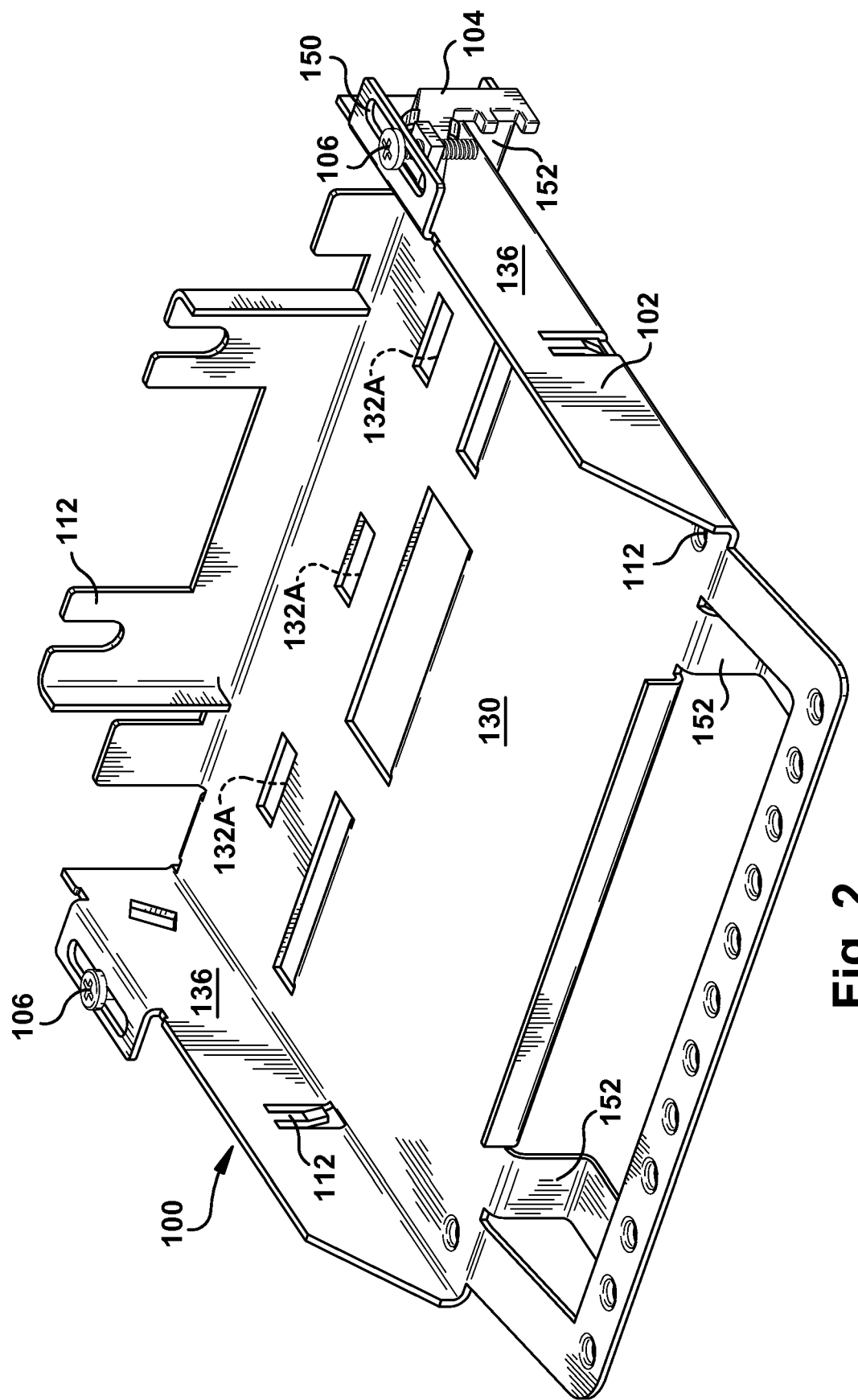
FIG. 2 is a perspective view of embodiments of a base of the rail mounting apparatus of FIG. 1.

Referring to the drawings, a rail mounting apparatus 100 according to embodiments of the invention is illustrated. As shown in FIGS. 1-2, apparatus 100 mounts a base 102 using a mounting clip 104 and a connector 106 to any of a variety of rail 110 (FIG. 1 only), e.g., a DIN or top hat rail. As shown best in FIG. 2, base 102 may also include at least one mount 112 for coupling any of a variety of electronic device(s) 114 (FIG. 1) thereto, e.g., circuit boards, circuit breakers, input/output modules, switches, etc. It is understood that non-electronic devices may also be mounted to base 102. As will become apparent herein, apparatus 100 is capable of mounting base 102 to a rail 110 that is at any angle, i.e., horizontal, vertical or otherwise. As shown best in FIGS. 1, 3A and 3B, rail 100 may include an elongated conductive channel member 120 having side edge flanges 122A, 122B to which rail mounting apparatus 100 connects. As will be described in greater detail herein, the depth of channel member 120 may vary.

Referring to FIGS. 1, 2, 3A and 3B, the details of base 102 will now be described. In one embodiment, base 102 may be made of a sheet metal material, e.g., steel or other rigid metal, which is stamped into the shape shown. Alternatively, base 102 may be constructed of separate parts that are otherwise connected by, for example, fasteners or welding. Base 102 includes a mount surface 130 including at least one tab 132A, 132B for mounting a first edge 122A of rail 110 relative to mount surface 130. In one embodiment, each tab(s) 132A, 132B includes a stamped protrusion in sheet metal material, which may or may not penetrate the sheet metal. Alternatively, it is understood that tab(s) 132A, 132B may be provided in a variety of other ways, e.g., by welding an element onto mount surface 130. The number of tab(s) 132A, 132B and the length of each tab provided may vary depending on the size of base 102 and/or electronic devices 114 to be mounted thereto. In one embodiment, as shown best in FIG. 2, a plurality of tabs 132A may extend linearly across mount surface 130. In another embodiment, shown in FIGS. 3A-3B, a plurality of tab sets 134A, 134B may be provided. In this case, as seen in FIGS. 3A-3B, each set 134A, 134B includes a plurality of tabs 132A or 132B, respectively, extending linearly across mount surface 130 with each set protruding to a different extent to accommodate different sized rails 100 with a single base 102. More particularly, in the FIG. 3A embodiment, channel 110 has dimensions such that first edge 122A is mounted against mount surface by tab(s) 132A; while in the FIG. 3B embodiment, first edge 122A is held in position relative to mount surface 130 by tab(s) 132B. More than two sets 134A, 134B may also be provided.

Base 102 also includes a side surface 136 including a guide clip 138 for slidingly positioning mounting clip 104, as will be described in greater detail herein. In the illustrated embodiment, base 102 includes a pair of side surfaces 136, but this may not be necessary in all cases. In one embodiment, guide clip 138 may include a pair of stamped protrusions 140 in the sheet metal material, but may also be provided in a variety of other ways, e.g., by welding an element onto side surface 136. Base 102 also includes a connector guide slot 150 extending from side surface 136 for slidingly positioning connector 106, as will be described in greater detail herein. Guide slot 150 is illustrated as extending substantially perpendicularly from side surface 136 of base 102, but this may not be necessary in all cases, depending on the form of connector 106. Connector guide slot 150 may be punched into the sheet metal material, but may also be provided in a variety of other ways, e.g., by welding an element onto side surface 136. A plurality of legs 152 may also be provided on base 102 for supporting the base on a surface, e.g., during connection of electrical device(s) 114.

Figure 4:
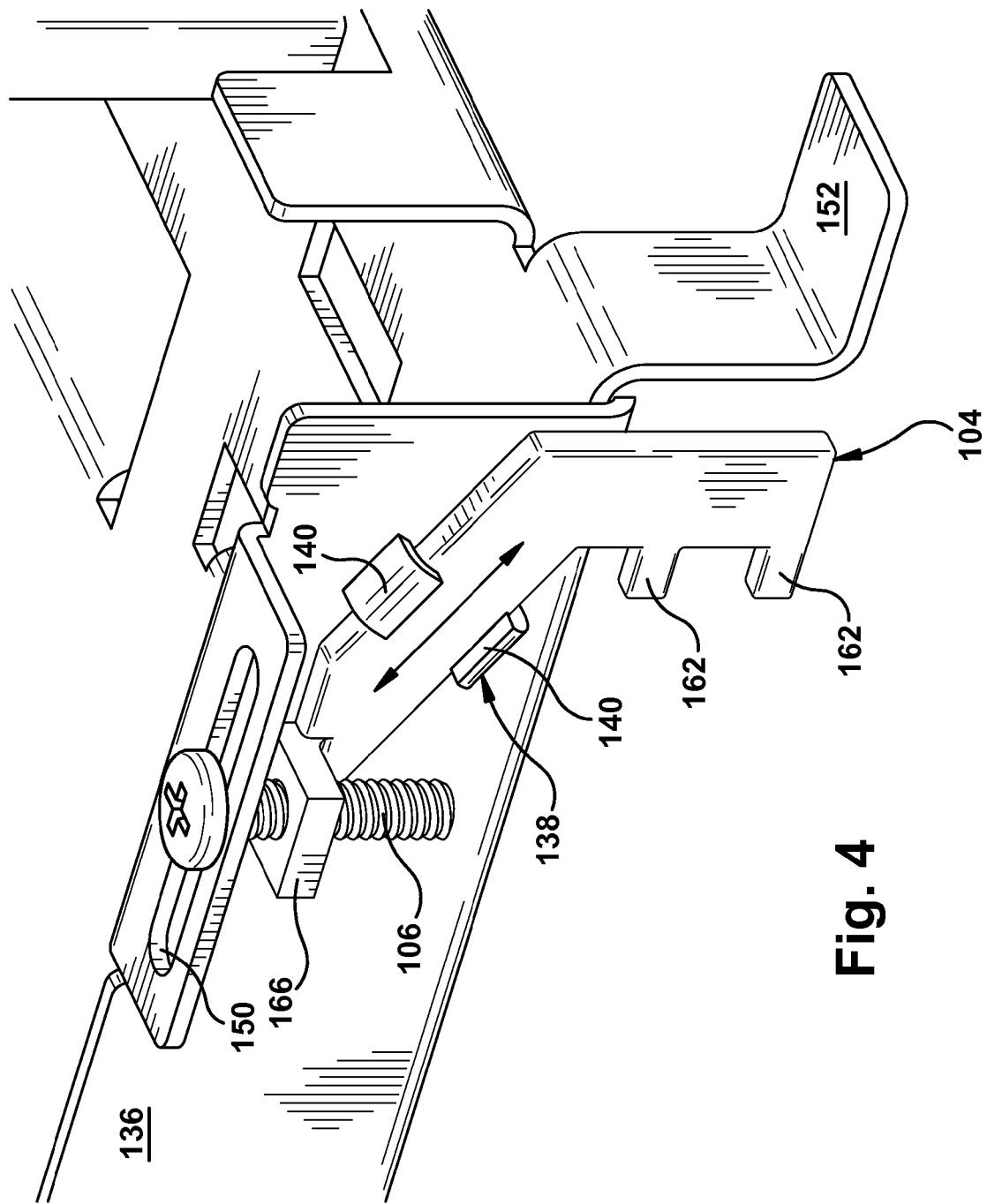
FIG. 4 is an enlarged perspective view of a detail of the rail mounting apparatus.
Figure 5:
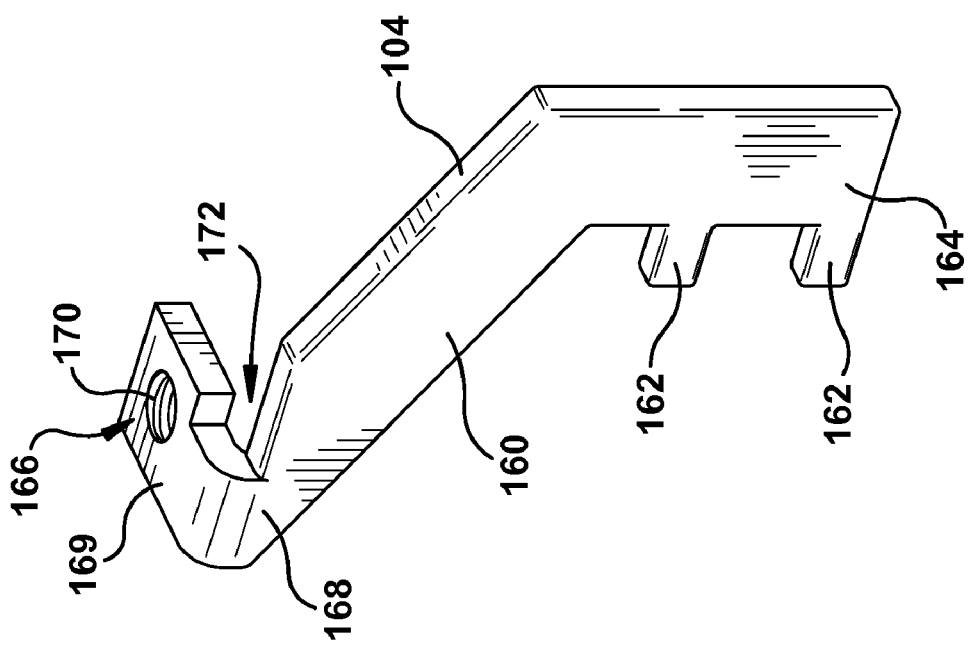
FIG. 5 is a perspective view of embodiments of a mounting clip.

Referring to FIGS. 3A, 3B, 4 and 5, details of mounting clip 104 will now be described. As shown best in FIG. 5, mounting clip 104 includes a body 160 having a rail engaging member 162 at a first end 164 for engaging a second edge 122B of rail 110 (FIGS. 3A, 3B) and a connector mount 166 at a second end 168 of body 160. Body 160, as shown in FIGS. 3A, 3B and 4, is slidingly mounted in guide clip 138 such that it can move relative to base 102. Body 160 may be snapped fit into guide clip 138. First end 164 of mounting clip 104 may extend at an angle relative to body 160 such that rail engaging member(s) 162 extends substantially perpendicularly to the first end for engagement with edge 122B. Connector mount 166 may include an opening containing tab 169 (FIG. 5 only) extending substantially perpendicularly from body 160 of mounting clip 104; however, other structure and/or positioning may be possible. As shown in FIG. 5, mounting clip 104 may also optionally include a notch 172 between body 160 and opening containing tab 169 to facilitate use of mounting clip 104, e.g., aids in coupling of mounting clip 104 to guide clip 138. While two rail engaging members 162 are illustrated to accommodate different sized rails 110, it is understood that one or more than two rail engaging members 162 may also be provided. In one embodiment, mounting clip 104 may be made of a sheet metal material, if desired.

Figure 6:
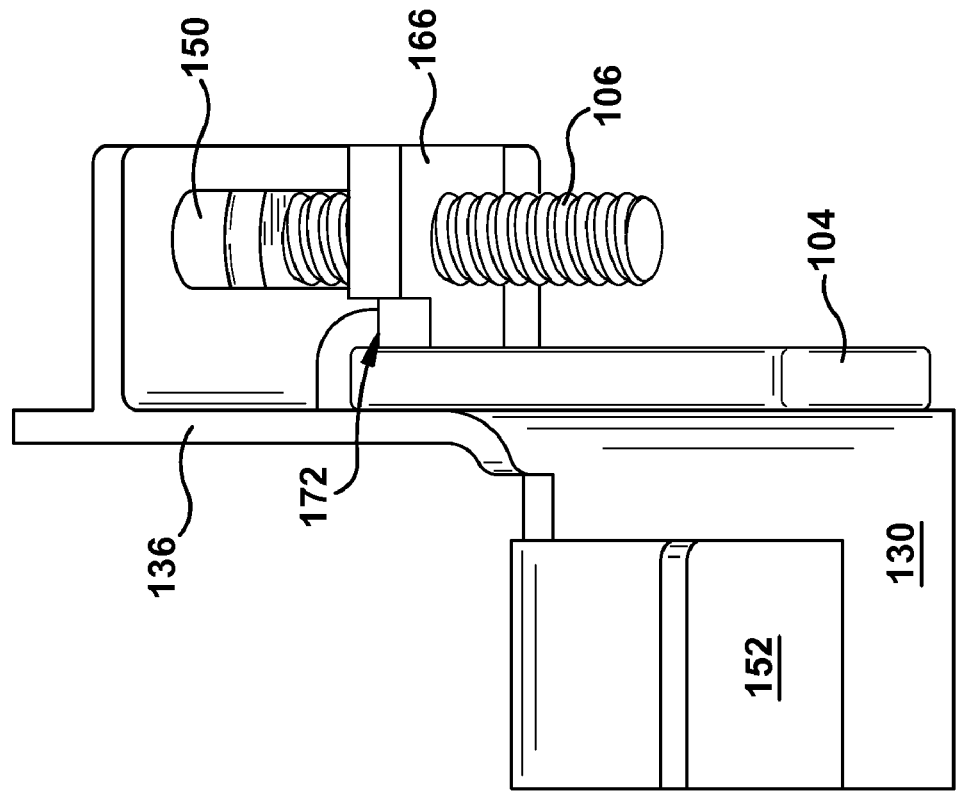
FIG. 6 is an alternative perspective view of a detail of the rail mounting apparatus.

Connector 106 extends through guide slot 150 (FIG. 6) and is received in connector mount 166 of mounting clip 104. In one embodiment, connector 106 includes a threaded bolt and connector mount 166 includes a complementarily threaded opening 170 (FIG. 5 only) for the threaded bolt. However, it is recognized that connector 106 may take a variety of forms capable of adjustable, fixed connection with connector mount 166. For example, connector 106 may include a variety of other two-way adjustable connectors, or a one way connector such as a plastic, serrated bolt capable of positioning within connector mount 166. In any event, as shown best in FIG. 6, connector 106 is incapable of passing through guide slot 150.

In operation, base 102 is set on a surface and any electrical device(s) 114 necessary are coupled thereto. Base 102 is then positioned with tab(s) 132A or 132B against first edge 122A of rail 110. The tabs used will depend on the depth of channel member 120. Once in position, connector 106 is adjusted to pull mounting clip 104 into a secure position with a rail engaging member 162 against second edge 122B of rail 110. That is, adjustable coupling of connector 106 to connector mount 166 slidingly moves mounting clip 104 in guide clip 138 to engage rail engaging member 162 with second edge 122B of rail 110 and hold second edge 122B of the rail relative to mount surface 130 of base 102. Depending on the size of rail 110, the rail may be pulled against mount surface 130, as shown in FIG. 3A, or may be held relative to mount surface 130, as shown in FIG. 3B. Where connector 106 includes a threaded bolt, any conventional tool, e.g., wrench, screwdriver, socket wrench, etc., can be used to adjust the connector to move mounting clip 104 into engagement with second edge 122B. As described above, tab(s) 132A, 132B hold first edge 122A relative to mount surface 130 of base 102. Consequently, rail 110 is held in position relative to base 102 regardless of the position (horizontal, vertical, etc.) of rail 110. While the above-described embodiments include two mounting clips 104, one on each side surface 136 of base 102, it is understood that, depending on application (e.g., weight of devices 114), only one mounting clip 104 may be employed. Similarly, more than two mounting clips 104 may be employed in other applications requiring further securing of base 102 to rail 110.

Rail mounting apparatus 100 is capable of mounting a base 102 of various dimensions, and could be used to mount a variety of electrical device(s) 114. In particular, since mounting clip(s) 104 and legs 152 are external to the "holding area" of base 102, i.e., where electrical device(s) 114 are coupled, rail mounting apparatus 100 is not constrained to a specific geometry. In addition, the structure is relatively inexpensive to make (could all be sheet metal except connector), yet maintains quick connect/disconnect capabilities, if desired. The force available from connector 106 is adequate in grounding base 102 to rail 110.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The modifier "about" used in connection with a quantity is inclusive of the stated value and has the meaning dictated by the context, (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to about 25 wt %, or, more specifically, about 5 wt % to about 20 wt %", is inclusive of the endpoints and all intermediate values of the ranges of "about 5 wt % to about 25 wt %," etc).

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A rail mounting apparatus comprising:
   a base including:
      a mount surface including at least one tab for mounting a first edge of the rail relative to the mount surface,
      a side surface including a guide clip, and
      a connector guide slot extending from the side surface;
   a mounting clip including:
      a body slidingly mounted in the guide clip,
      a rail engaging member at a first end of the body for engaging a second edge of the rail,
      a connector mount at a second end of the body; and
   a connector extending through the guide slot and received in the connector mount of the mounting clip,
   wherein coupling of the connector to the connector mount slidingly moves the mounting clip in the guide clip to engage the rail engaging member with the second edge of the rail and hold the second edge of the rail relative to the mount surface of the base.

2. The rail mounting apparatus of claim 1, wherein the base is made of a sheet metal material.

3. The rail mounting apparatus of claim 2, wherein the guide clip includes a pair of stamped protrusions in the sheet metal material.

4. The rail mounting apparatus of claim 2, wherein the at least one tab each includes a stamped protrusion in the sheet metal material.

5. The rail mounting apparatus of claim 1, wherein the connector includes a threaded bolt and the connector mount includes a complementarily threaded opening for the threaded bolt.

6. The rail mounting apparatus of claim 1, wherein the connector mount includes an opening containing tab extending substantially perpendicularly from the body of the mounting clip.

7. The rail mounting apparatus of claim 6, wherein the guide slot extends substantially perpendicularly from the side surface of the base.

8. The rail mounting apparatus of claim 6, further comprising a notch between the body and the opening containing tab.

9. The rail mounting apparatus of claim 1, wherein the base further includes at least one mount for coupling an electronic device to the base.

10. The rail mounting apparatus of claim 1, wherein the rail engaging member includes a plurality of rail engaging members to accommodate different sized rails.

11. The rail mounting apparatus of claim 1, wherein the first end of the mounting clip extends at an angle relative to the body, and the rail engaging member extends substantially perpendicularly to the first end.

12. The rail mounting apparatus of claim 1, wherein the at least one tab includes a plurality of tabs extending linearly across the mount surface.

13. The rail mounting apparatus of claim 1, wherein the at least one tab includes a plurality of tab sets, each set including a plurality of tabs extending linearly across the mount surface with each set protruding to a different extent to accommodate different sized rails.

14. The rail mounting apparatus of claim 1, wherein the base includes a plurality of legs for supporting the base on a surface.

15. A rail mounting apparatus comprising:
   a base made of a sheet metal material, the base including:
      a mount surface including at least one tab for mounting a first edge of the rail relative to the mount surface,
      a side surface including a guide clip including a pair of stamped protrusions in the sheet metal material, and
      a connector guide slot extending from the side surface;
   a mounting clip made of a sheet metal material and including:
      a body slidingly mounted in the guide clip,
      a plurality of rail engaging members at a first end of the body, a selected one of the plurality of rail engaging members for engaging a second edge of the rail,
      a connector mount at a second end of the body, the connector mount including a threaded opening containing tab extending substantially perpendicularly from the body of the mounting clip; and
   a threaded connector extending through the guide slot and received in the threaded opening in the connector mount of the mounting clip,
   wherein threaded coupling of the connector to the connector mount slidingly moves the mounting clip in the guide clip to engage the selected one of the plurality of rail engaging members with the second edge of the rail and holds the second edge of the rail relative to the mount surface of the base.

16. The rail mounting apparatus of claim 15, wherein the at least one tab each include a stamped protrusion in the sheet metal material.

17. The rail mounting apparatus of claim 15, wherein the guide slot extends substantially perpendicularly from the side surface of the base.

18. The rail mounting apparatus of claim 15, further comprising a notch between the body and the threaded opening containing tab.

19. The rail mounting apparatus of claim 15, wherein the second end of the mounting clip extends at an angle relative to the body, and the plurality of rail engaging members extend substantially perpendicularly to the second end.

20. The rail mounting apparatus of claim 15, wherein the at least one tab includes a plurality of tab sets, each set including a plurality of tabs extending linearly across the mount surface with each set protruding to a different extent to accommodate different sized rails.

* * * * *